US006818521B2

(12) United States Patent
Hiratsuka

(10) Patent No.: US 6,818,521 B2
(45) Date of Patent: Nov. 16, 2004

(54) METHOD OF MANUFACTURING A HETERO-JUNCTION BIPOLAR TRANSISTOR WITH EPITAXIALLY GROWN MULTI-LAYER FILMS AND ANNEALING AT OR BELOW 600° C.

(75) Inventor: Kenji Hiratsuka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/420,933

(22) Filed: Apr. 23, 2003

(65) Prior Publication Data

US 2003/0232478 A1 Dec. 18, 2003

(30) Foreign Application Priority Data

Apr. 23, 2002 (JP) .......................... 2002-121102

(51) Int. Cl.[7] .................. H01L 21/8224; H01L 21/331
(52) U.S. Cl. ..................... 438/336; 438/341; 438/343
(58) Field of Search .............................. 438/336, 341, 438/343, 481

(56) References Cited

U.S. PATENT DOCUMENTS 5,266,504 A * 11/1993 Blouse et al. ............... 438/364

FOREIGN PATENT DOCUMENTS

| JP | 09-205101 | 8/1997 |
| JP | 2000-012557 | 1/2000 |

OTHER PUBLICATIONS

"Performance and Stability of VOVPE–Grown Carbon–Doped InP/InGaAs HBT's Dehydrogenated by an Anneal after Emitter Mesa Formation", Kurishima et al., Japan J. of Appl. Phys., vol. 37 (1998), pp. 1353–1358.*

Dietmar Keiper, et al., Metalorganic Vapour Phase Epitaxy Growth of InP–based Heterojunction Bipolar Transistors with carbon Doped InGaAs Base Using Tertiarybutylarsine and Tertiarbutyphosphine in $N_2$ Ambient, Jpn. J. Appl. Phys. vol. 39 (2000) pp. 6162–6165.

A. Lindner, et al., The Role of Hydrogen in Low–Temperature MOVPE Growth and Carbon Doping of $In_{0.53}Ga_{0.47}As$ for InP–Based HBT, Journal of Crystal Growth 170(1997) pp. 287–291.

* cited by examiner

*Primary Examiner*—William M. Brewster
(74) *Attorney, Agent, or Firm*—Smith, Gambrell & Russell, LLP

(57) ABSTRACT

This invention provides a method for manufacturing a hetero-junction bipolar transistor, in which a hole concentration of a base layer doped with carbon can be increased. The method comprises the following steps. 1) A sub-collector 30, a collector 50, a base 60 doped with carbon are sequentially grown after setting a semiconductor substrate on the stage in the growth chamber; 2) an emitter 70 and an emitter contact 80 are grown at a temperature T; and 3) grown layers are annealed at a temperature TA, where the relation of $T < TA \leq 600°$ C. is satisfied. This process enhances the activation of carbon atoms by dissociating hydrogen atoms captured in the base 60 to the ambience.

11 Claims, 7 Drawing Sheets

METHOD OF MANUFACTURING A HETERO-JUNCTION BIPOLAR TRANSISTOR WITH EPITAXIALLY GROWN MULTI-LAYER FILMS AND ANNEALING AT OR BELOW 600° C.

BACKGROUND OF THE INVENTION

1. Field of the Invention

This invention relates to a method for manufacturing a hetero-junction bipolar transistor.

2. Related Prior Art

The hetero-junction bipolar transistor (HBT) has an attention for an amplifying device in a high-speed optical communication system due to its large current gain and an excellent high frequency performance. Since the HBT has an emitter with band gap energy greater than that of a base, a minority carrier injection from the base to the emitter is prevented. Therefore, even when a majority carrier concentration in the base is increased, the current gain of the transistor can be kept high. Moreover, to increase the majority carrier in the base can be tied up to a thinner base, thereby shortening a carrier drifting time and enhancing the high frequency performance.

The HBT composed of group III–V semiconductor materials is likely to configure an n-p-n type transistor, because the mobility of electrons is far greater than that of holes in such compound semiconductor. Conventionally, zinc (Zn) is used as a dopant material for the acceptor of the compound semiconductor. However, since the maximum solubility of Zn in compound semiconductor is so limited that the hole concentration is $2 \times 10^{19}$ cm$^{-3}$ at a maximum, the base with a high hole concentration can not be obtained. Moreover, since Zn easily diffuses in the compound semiconductor, a doping profile of Zn is likely to widen, thereby increased the equivalent thickness of the base and decreases the performance of the transistor. Further, the diffusion of Zn atom causes the deterioration of the reliability.

Recently, carbon (C) substituting for Zn is going to use as a p-type dopant material for III–V compound semiconductor such as InP, GaAs, InGaP and InGaAsP. The reasons to apply carbon are that the maximum hole concentration exceeds that for the zinc, and carbon hardly diffuses in the semiconductor material. This results in the advantage of the designing the epitaxial layer structure and HBT with a high reliability.

However, it is not always so simple to utilize the advantage of carbon because of its inferior activation efficiency. During the growth of a semiconductor layer doped with carbon, hydrogen atoms or hydrogen radicals are generated due to the decomposition of hydrides compound such as arsine (AsH$_3$) or phosphine (PH$_3$). Carbon atoms can easily combine with hydrogen atoms or hydrogen radicals, make a C—H bond and is brought within the semiconductor crystal. The carbon with C—H bond is passivated and is hard to function as an acceptor, which restricts the hole concentration.

SUMMARY OF THE INVENTION

An object of the present invention is to provide a method for manufacturing an HBT having a base layer doped with carbon and for enhancing a hole concentration by an activation of the carbon.

The method according to the present invention comprises the steps of: (1) epitaxially growth of a multi-layered semiconductor film having a collector film, a base film containing carbon atoms as dopants, an emitter film and an emitter contact film on a semiconductor substrate, (2) annealing the multi-layered semiconductor film by a predetermined period, and (3) forming the multi-layered semiconductor film to make an collector layer, a base layer, an emitter layer, and an emitter contact layer. The relation between temperatures of the present invention is denoted by $T<T_A \leqq 600°$ C., where T is a growth temperature of the emitter film and the emitter contact film and $T_A$ is an annealing temperature.

Since the annealing is performed at $T_A$ higher than the growth temperature of the emitter film and the emitter contact film, hydrogen captured in the base film can be dissociated therefrom even after the growth of the emitter film and the emitter contact film, thereby enhancing the hole concentration of the base layer. Moreover, since the annealing is performed below 600° C., the deterioration of the surface morphology of grown semiconductor layer can be prevented.

The growth temperature T of the emitter film and the emitter contact film is preferably higher than 500° C. By setting the growth temperature T to be higher than 500° C., hydrogen can dissociate from the base film without deteriorating the crystal quality and the surface morphology of the grown layer.

The annealing period is preferably longer than 5 minutes. By setting the annealing period to be at least 5 minutes, hydrogen captured in the base film can be dissociated therefrom.

The annealing is preferably performed under nitrogen atmosphere. By using the nitrogen for the ambience, it is unnecessary to provide a supplemental pass for supplying an arsenic compound such as Tri-Methyl-Arsine (TMAs), whereby an ordinarily growing apparatus can be applied. Moreover, it is unnecessary to bring the semiconductor substrate out of the reactor chamber.

The present invention may include a further growth of an additional cover layer before annealing and a removal of the additional cover layer after annealing. Inserting and removing the additional cover layer can keep the surface morphology of the multi-layered semiconductor film kept on a good quality.

The HBT of the present invention preferably has an InP for the semiconductor substrate and for the emitter layer, an InGaAs lattice matched to InP for the collector layer, the base layer and the emitter contact layer. Moreover, The collector layer, the emitter layer and the emitter contact layer preferably contain silicon as an n-type dopant.

Figure 2A:
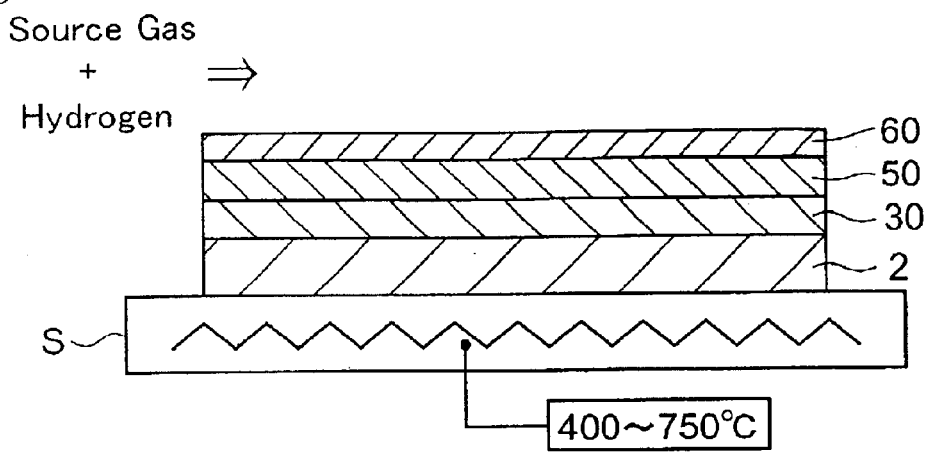
Figure 2B:
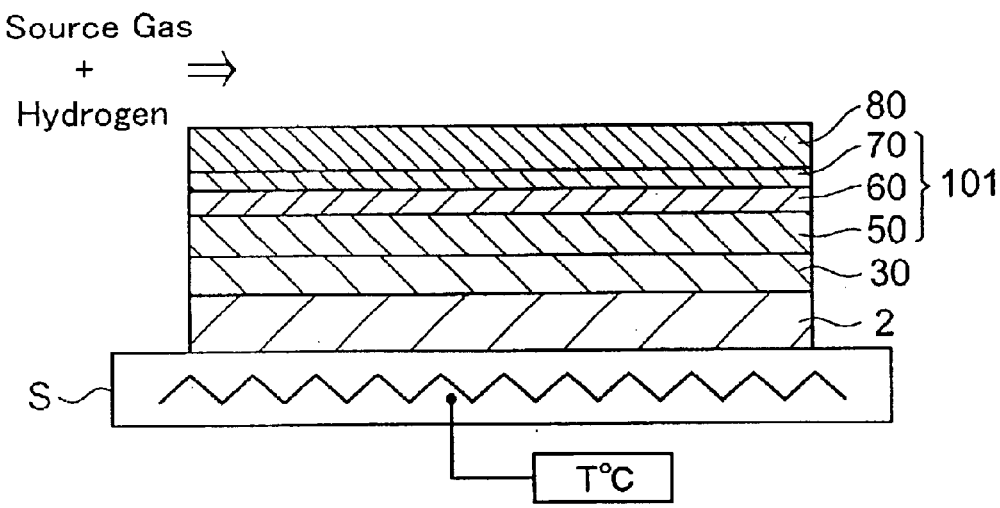
Figure 2C:
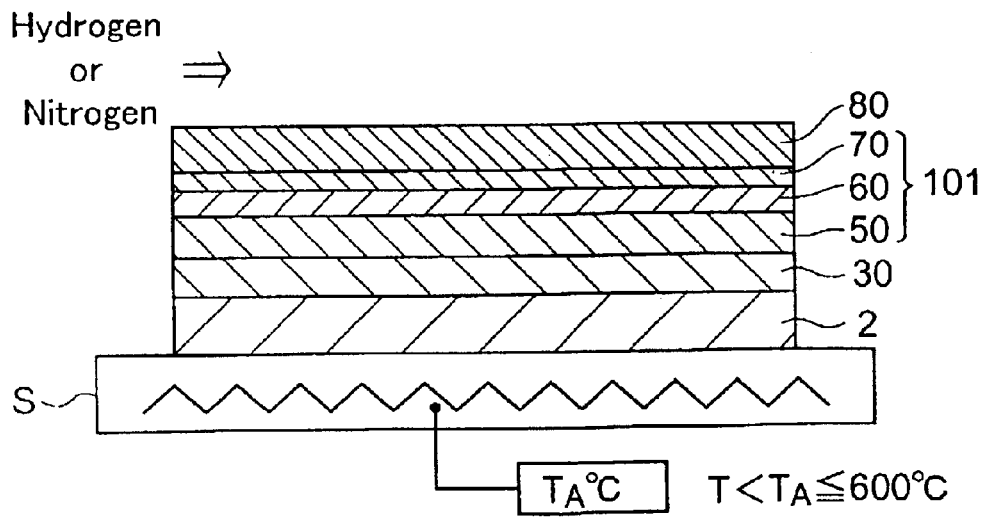
Figure 3A:
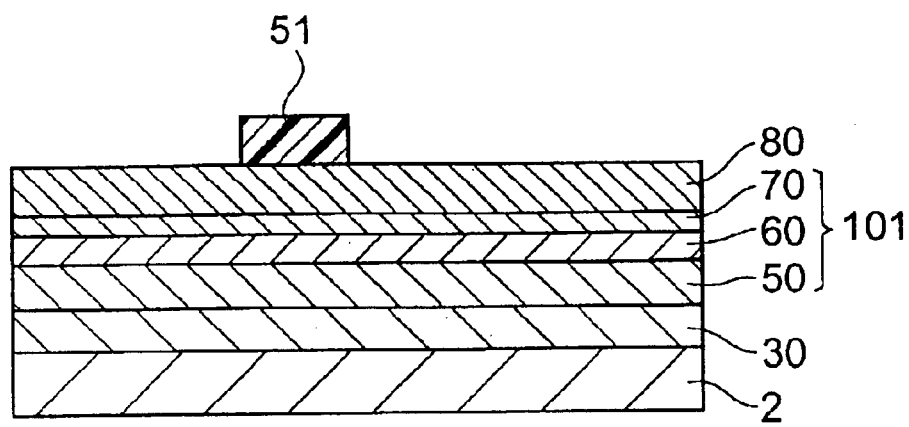
Figure 3B:
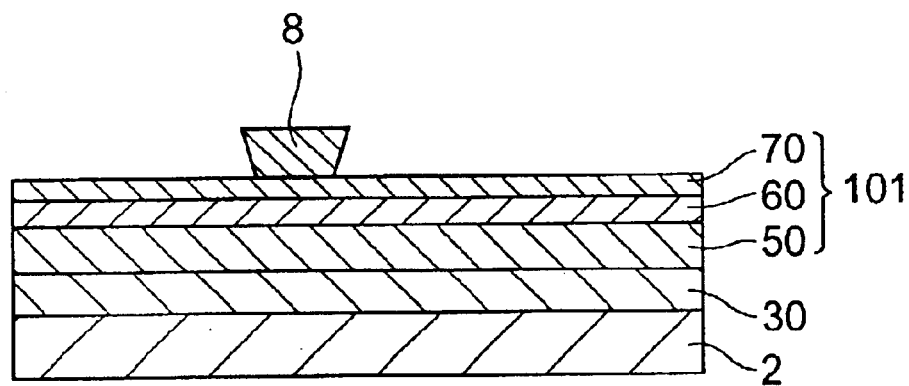
Figure 3C:
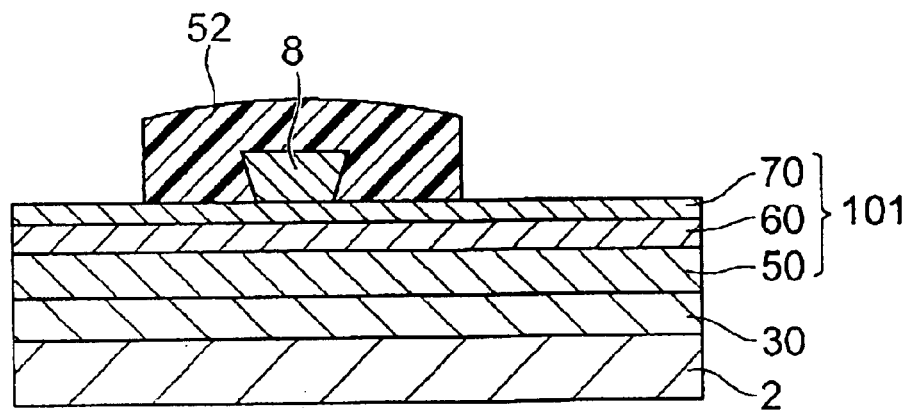
Figure 4A:
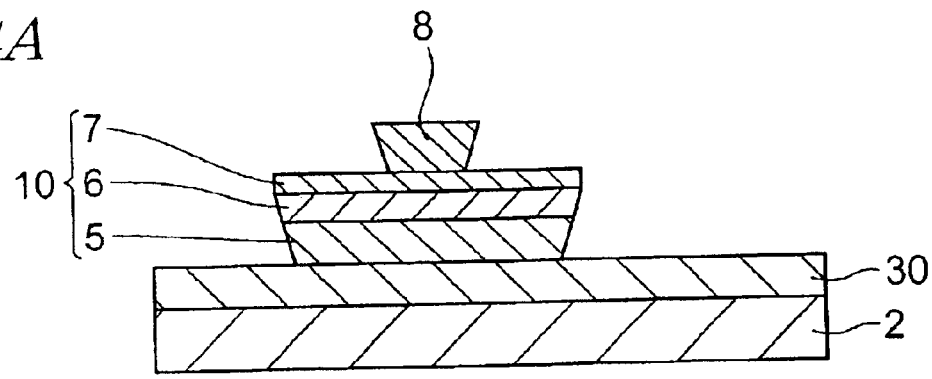
Figure 4B:
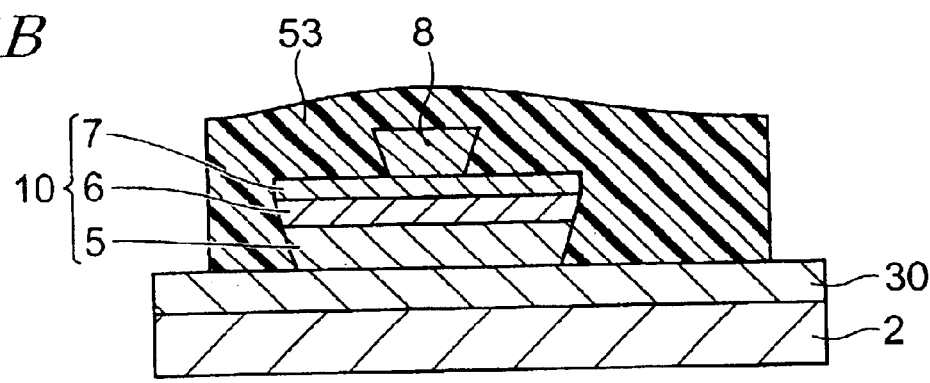
Figure 4C:
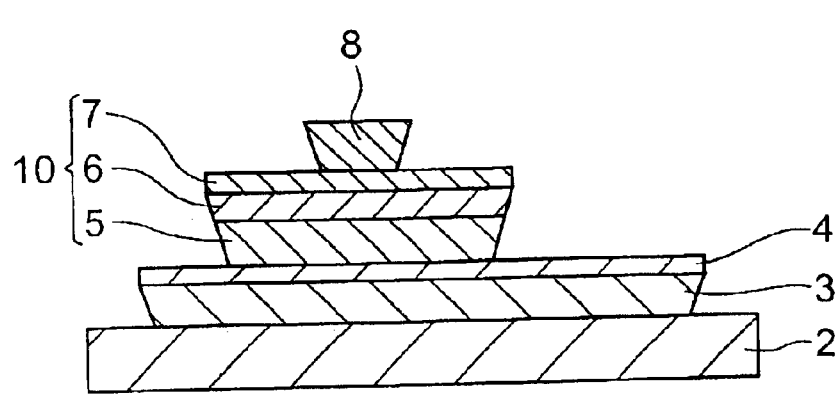
Figure 5A:
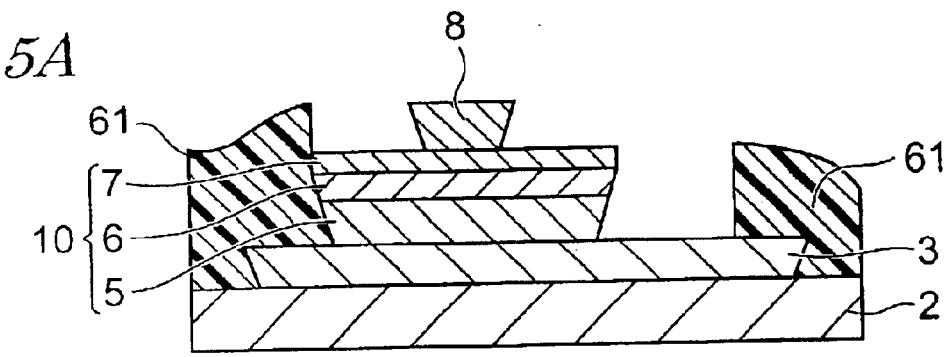
Figure 5B:
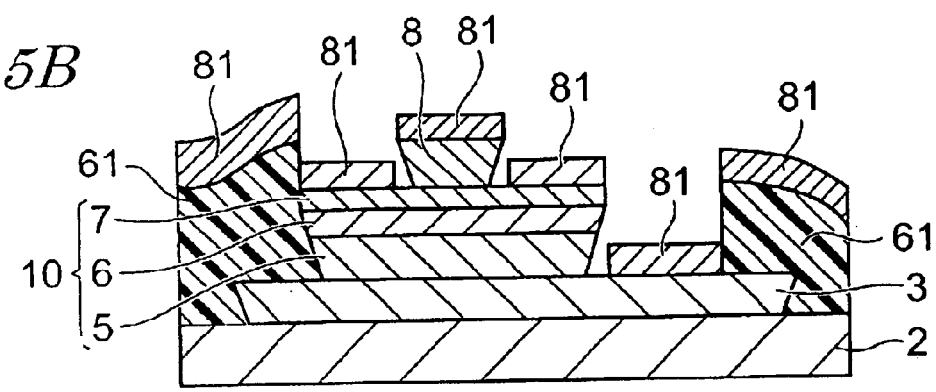
Figure 5C:
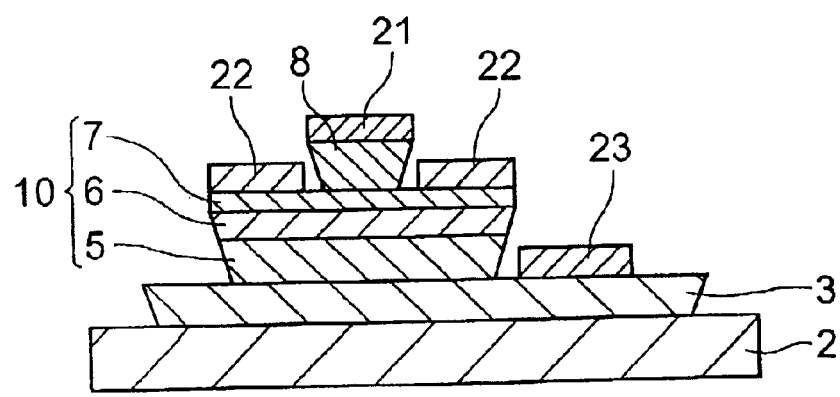
Figure 6A:
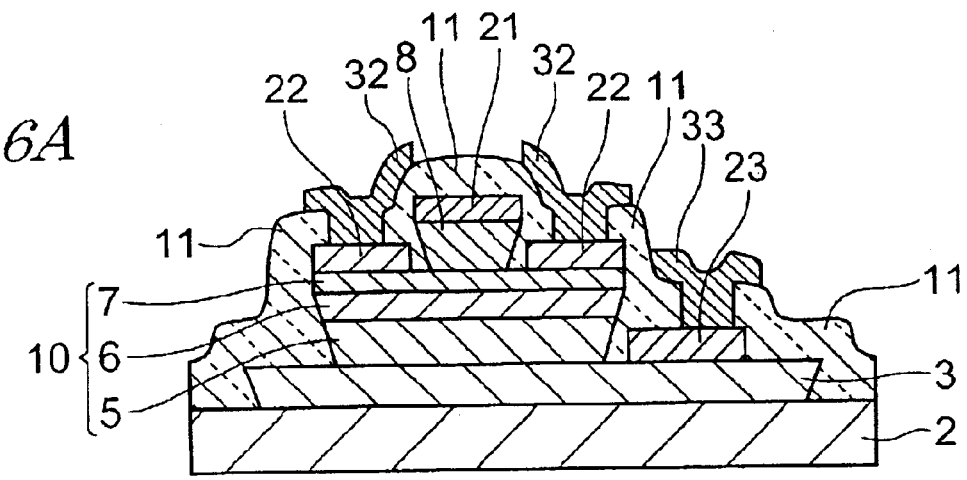
Figure 6B:
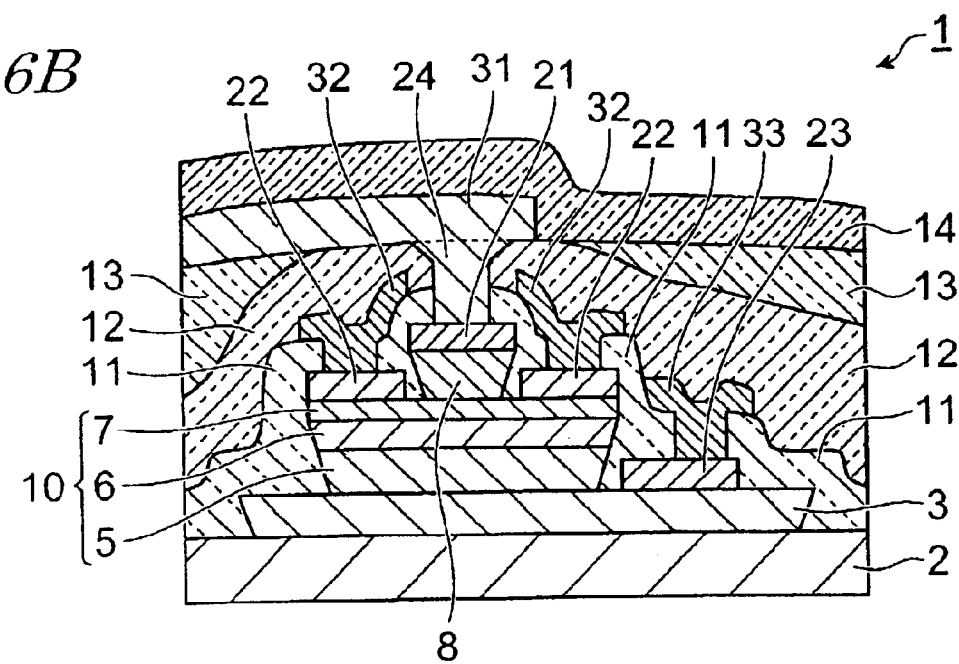

From FIG. 2A to FIG. 2C illustrate manufacturing steps of the present HBT;

From FIG. 3A to FIG. 3C illustrate manufacturing steps of the present HBT;

From FIG. 4A to FIG. 4C illustrate manufacturing steps of the present HBT;

From FIG. 5A to FIG. 5C illustrate manufacturing steps of the present HBT;

From FIG. 6A and FIG. 6B illustrate manufacturing steps of the present HBT; and

Figure 7:
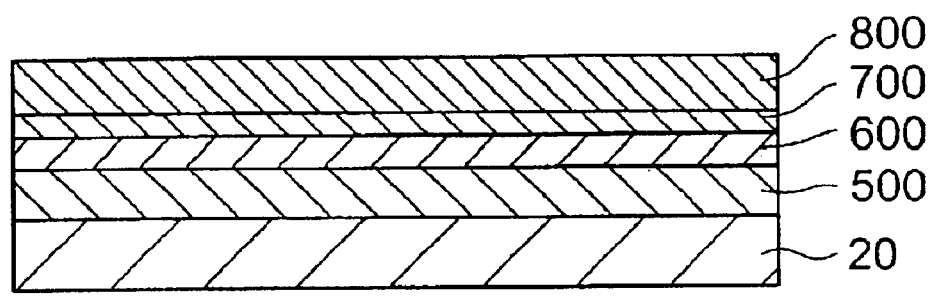

FIG. 7 is schematic diagram showing the sample used in an experiment.

DETAILED DESCRIPTION OF EMBODIMENTS

Preferred embodiment of the present invention will be described in detail hereinbelow together with the drawings.

In embodiments, an HBT formed on an InP substrate is described. Elements identical to each other will be referred to with numerals identical to each other without overlapping explanations. In the drawings, dimensions such as layer thickness will not always reflect their explanation. Indices of surface and axis appearing in the drawings are exemplary and would contain their equivalent.

Figure 1A:
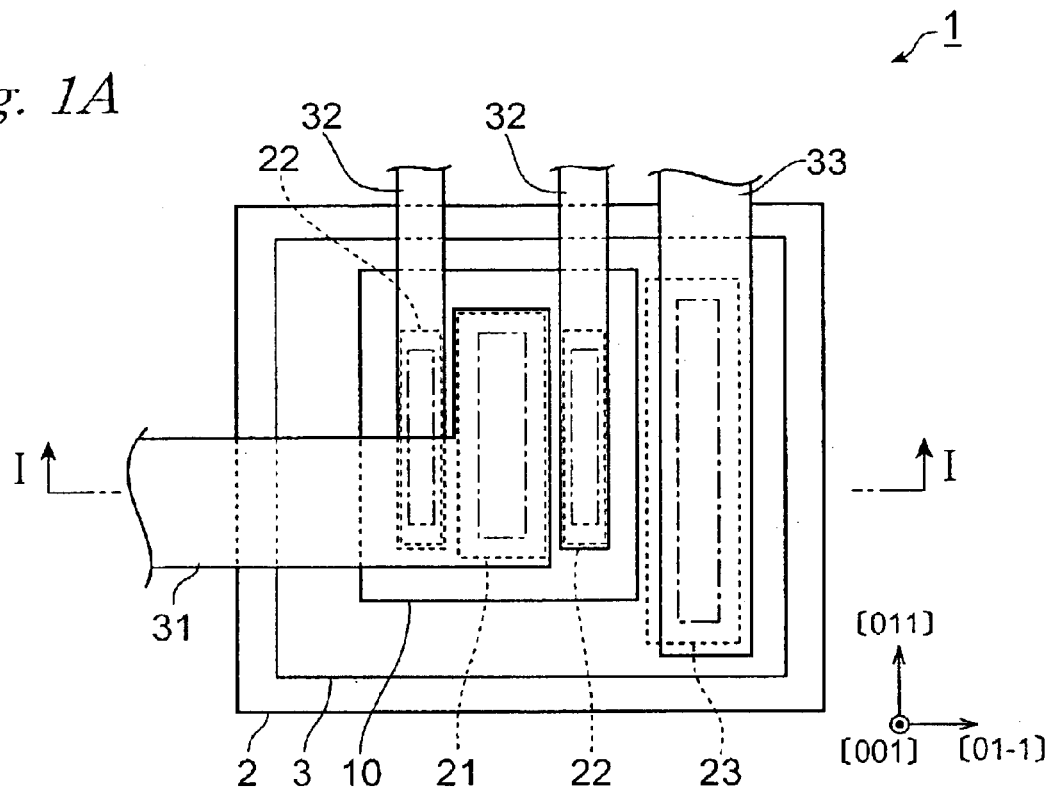
FIG. 1A is a plan view showing the HBT of the present invention.
Figure 1B:
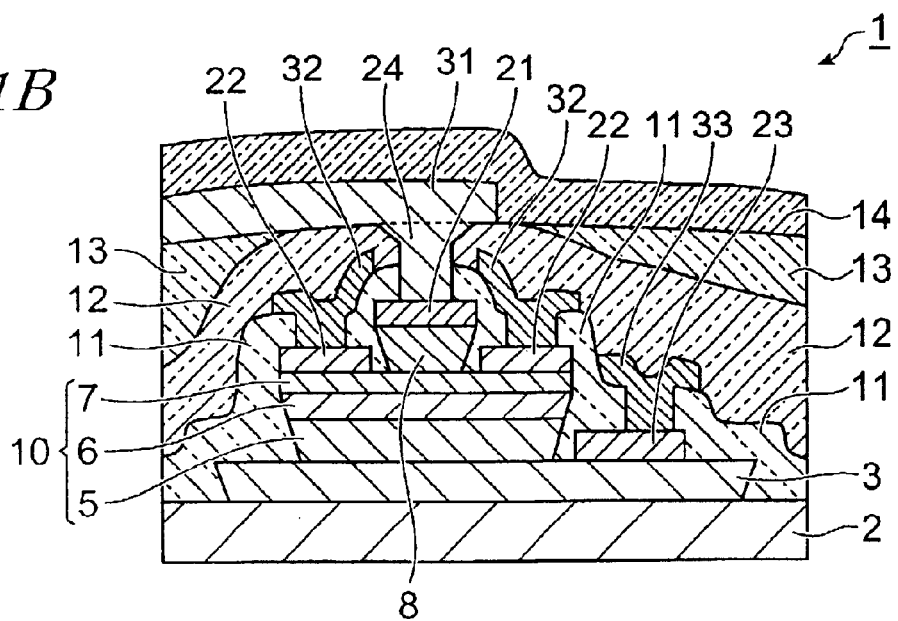
FIG. 1B is a sectional taken along the line I—I in FIG. 1A.

FIG. 1A is a plan view showing an HBT according to the present invention and FIG. 1B is a sectional taken along the line I—I in FIG. 1A, which extends along [01-1] crystal orientation. In FIG. 1B, the HBT 1 comprises a semi-insulating InP substrate 2, a sub-collector mesa formed on the substrate 2, a primary mesa 10 formed on the sub-collector mesa 3, and an emitter contact mesa 8 formed on the primary mesa 10. The primary mesa 10 contains a collector layer 5, a base layer 6, and an emitter layer 7.

The following table lists an exemplary configuration, such as a thickness, dopants, and a carrier concentration, of respective semiconductor layer. As shown in table I, the sub-collector mesa 3, the collector layer 5, and the emitter layer 7 contain silicon (Si) as an n-type dopant, while the base layer 6 contains carbon as a p-type dopant.

The emitter layer 7 is made of InP, while the rest layer except for the emitter layer are made of $In_xGa_{1-x}As$ (hereinafter denoted by InGaAs). A composition X of $In_xGa_{1-x}As$ is selected to be X=0.53, whereby a lattice constant of the $In_xGa_{1-x}As$ matches with that of InP within ±0.1%.

TABLE I

| Layer | Material | Thickness (nm) | Dopant | Carrier Concentration ($cm^{-3}$) |
|---|---|---|---|---|
| Emitter Contact 8 | InGaAs | 300 | Si | $1.0 \times 10^{19}$ |
| Emitter 7 | InP | 10 | Si | $4.0 \times 10^{18}$ |
| Base 6 | InGaAs | 50 | C | $2.5 \times 10^{19}$ |
| Collector 5 | InGaAs | 300 | Si | $5.0 \times 10^{16}$ |
| Sub-Collector 3 | InGaAs | 300 | Si | $1.0 \times 10^{19}$ |

In FIG. 1A, the emitter contact mesa 8 is substantially rectangle, a longer side of which extends along the [011] orientation while a shorter side of which extends the [01-1] orientation. A side surface extending along the [011] orientation has a shape of a reverse trapezoid as shown in FIG. 1B.

An emitter electrode 21, a base electrode 22 and a collector electrode 23 are provided on the emitter contact mesa 8, the emitter layer 7, and the sub-collector mesa 3, respectively. The shape of the emitter electrode 21 is nearly rectangle as shown in FIG. 1A, with a width of about 1 micron ($\mu$m) and a length from 10 to 100 micron ($\mu$m). Two base electrodes 22 sandwich the emitter contact mesa 8.

Although the collector electrode 23 faces one side of the primary mesa 10 in FIG. 1A, two collector electrodes may sandwich the primary mesa 10 similar to the configuration for the base electrode. These electrodes from the emitter 21 to the collector 23 are made of stacked metals of platinum (Pt), titanium (Ti), platinum (Pt), and gold (Au). A thickness of gold is preferably about 160 nm, while the other metals are preferably about 20 nm. Non-rectifier characteristic to the corresponding semiconductor layers is realized by alloying of these metals. Although the base electrode is formed on the emitter layer 7, which is not formed on the base layer 6, metals of base electrode penetrate and diffuse to the base layer by alloying, thereby connected to the base layer.

Next, a method of manufacturing the HBT 1 according to the present invention will be described. From FIGS. 2A to 2C, FIGS. 3A to 3C, FIGS. 4A to 4C, FIGS. 5A to 5C, and FIG. 6A and FIG. 6B are drawings that describe respective manufacturing process of the HBT 1, which are sectional views cut along the [01-1] orientation.

Epitaixial Growth

First, a process of the epitaxial growth will be explained. In the present epitaxial growth, an Organo-Metallic Vapor Phase Epitaxy (OMVPE) technique is performed using Tri-Ethyl-Gallium (TEGa), Tri-Methyl-Indium (TMIn), Arsine ($AsH_3$), and Phosphine ($PH_3$) are used for source materials of the epitaxial growth. Tri-Methyl-Gallium (TMGa) may be applicable instead of TEGa. Tertiary-Butyl-Arsine (TBA) and Tertiary-Butyl-Phosphine (TBP) may replace with Arsine and Phosphine, respectively. In order to control a conducting type and a carrier concentration of respective semiconductor layers, silane ($SiH_4$) or di-silane ($Si_2H_6$) may be used for an n-type doping, while carbon-bromide ($CBr_4$) may be applicable for a p-type doping.

Following a semi-insulating InP substrate 2 is set on a stage S in the OMVPE reactor chamber, a sub-collector film 30, a collector layer 50, and a base layer 60 are epitaxially grown in this order on the (100) surface of the InP substrate 2. The respective films grown on the substrate 2 are formed into the sub-collector layer 3, the collector layer 5, and the base layer 6. These films are made of InGaAs.

During the growth of the sub-collector film, the silane ($SiH_4$) is supplied to dope Si atoms into the film; on the other hand, carbon-bromide ($CBr_4$) is supplied during the growth of the base film to dope C atoms. Since growth temperature of these layers are ranged from 400° C. to 750° C., it is preferable from 400° C. to 500° C. for the base film 60 to dope carbon atoms in high density, while it is preferable from 550° C. to 750° C. for the collector film 50. The growth temperature can be monitored by a thermocouple installed within the stage S or by a radiation pyrometer, which is not shown in the figure.

After the growth of the base film, TMIn, TEGa, and $CBr_4$ are stopped to supply while the temperature of the substrate is changed to a growth temperature T between 500° C. and $T_A$ under which a thermal treatment at the final stage will be performed, as arsine is continued to supply. After stabilizing the temperature of the substrate 2 to the growth temperature T, arsine is stopped to supply, and $PH_3$, TMIn, and $SiH_4$ that are source materials and dopant material for InP are supplied, thereby starting the growth of InP emitter film 70. The emitter film 70 will be converted to the emitter layer 7, a carrier concentration of which is about $4.0 \times 10^{18}$ $cm^{-3}$.

Growing the emitter film 70 with a predetermined thickness, the supply of TMIn and $SiH_4$ are stopped, whereby a stacked semiconductor films are formed on the substrate 2. Keeping the temperature of the substrate 2 to the growth temperature T, an emitter contact film 80 made of InGaAs is grown by stopping the supply of $PH_3$ while $AsH_3$, TEGa, TMIn and $SiH_4$ are started to supply. The sequence described above forms a series of semiconductor films as shown in FIG. 2B.

(Thermal Treatment)

Next, a thermal treatment is preformed without bring the wafer out of the OMVPE reactor chamber. Namely, supplying hydrogen gas or nitrogen gas replaced with source materials such as TMIn, TEGa and $AsH_3$, the temperature of the substrate 2 is changed to an annealing temperature $T_A$, which is between 500° C. and 600° C. and over the growth temperature T for the emitter contact film 80, as shown in FIG. 2C. The relation between temperatures is denoted by:

$$T < T_A \leq 600° C.$$

The substrate is kept at least 5 minutes at the temperature $T_A$ when the keeping time is shorter than 5 minutes; the dissociation of hydrogen atoms from the base film is not sufficient. By keeping the substrate 2 to the annealing temperature $T_A$, hydrogen atoms captured in the base film 60 dissociates from the base film to the ambience through the emitter film 70 and the emitter contact film 80, thereby enhancing the activation efficiency of carbon atoms doped in the base film 60.

When the annealing temperature is below 500° C., hydrogen atoms from the base film can not pass the emitter film 70 and also the emitter contact film 80. On the other hand, the annealing temperature is over 600° C., arsenic atoms may dissolve from the surface of the emitter contact film 80, which results in the poor quality of the semiconductor film.

When the growth temperature T of the emitter film 70 and the emitter contact film 80 is higher than the annealing temperature $T_A$, the dissociation of hydrogen atoms from the base film may not occur. The reason why the dissociation is restrained is considered as follows. During the growth of the emitter film 70 and the emitter contact film 80, hydrogen atoms in the ambience may be brought to these films and diffuse to the base film 60. The concentration of the hydrogen in respective films is determined by the growth temperature, amount of the hydrogen atoms brought into the film from the ambience and the concentration of the carbon atoms in the film. In the present embodiment, the hydrogen concentration in the emitter film 70 and that in the emitter contact film 80 is considerably small because the carbon is not intentionally doped in these films. On the other hand, the quite large number of hydrogen atoms remains in the base film. Therefore, when the annealing temperature $T_A$ is below the growth temperature of the emitter film 70 and the emitter contact film 80, a diffusion velocity of hydrogen atoms remained in the base film 60 can not be enhanced, whereby the dissociation of the hydrogen atoms from the base film to the ambience is restrained. From the reason described above, it is necessary that the annealing temperature $T_A$ is higher than the growth temperature of the emitter film 70 and the emitter contact film 80.

(Formation of Emitter Contact Mesa)

Referring to FIG. 3A, an etching mask 51 is formed on the emitter contact film 80. A plane shape of the mask 51 is nearly rectangle with a longer side extending along the [011] orientation and a shorter side extending along the [01-1] orientation. The mask is a patterned photo-resist.

Etching of the exposed portion of the emitter contact film 80 from the mask 51 by a mixture of phosphoric acid, hydrogen peroxide and water makes the emitter contact mesa 8 on the emitter film 70. The solution of phosphoric acid, hydrogen peroxide and water shows an etching characteristic of InGaAs selectively to InP. Namely, the etching speed of the solution for InP is far less than that for InGaAs. Therefore, the etching substantially stops after exposure of InP of the emitter film 70. By the etching, the emitter contact mesa 8 is formed as shown in FIG. 3B. The above etchant also shows an in-homogeneity characteristic for the crystal orientation, which makes a reverse trapezoidal surface at edges extending along the [011] orientation.

Referring to FIG. 3C, another mask 52 that covers the emitter contact mesa 8 is formed on the emitter film 70. The plane shape of the mask 52 is also rectangle with a pair of side extending along the [011] orientation. The mask 52 is a patterned photo-resist.

After the formation of the etching mask 52, two-step etching is performed. First, a solution of hydrochloric acid and water etches an exposed portion of the emitter film 70. Since the etching speed of the solution for InGaAs is enough small, the etching of InP substantially stops after the exposure of the base film 60 made of InGaAs. Next, another etchant of the mixture of phosphoric acid, hydrogen peroxide and water etches the base film 60 and a portion of the collector film 50 so as to retain the sub-collector film without removing the etching mask 52. The etching time is determined so as to expose the substantial portion of the sub-collector film 30. After removing the etching mask 52, the primary mesa 10 can be obtained, where the edge of the mesa 10 extending along the [011] orientation has the reverse trapezoid, as shown in FIG. 4A.

(Sub-collector Mesa Formation)

Referring to FIG. 4B, an etching mask 53 covers the emitter contact mesa 8, the primary mesa 10 composed of the emitter layer 7, the base layer 6 and the collector layer 5, and a portion of sub-collector film 30. The plane shape of the mask 53 is nearly rectangle with a pair of one side extending along the [011] orientation. The mask 53 is a patterned photo-resist.

The exposed portion of the sub-collector film is etched by the solution of phosphoric acid, hydrogen peroxide and water. As mentioned before at the process of forming the emitter contact mesa, this etchant has the elective etching characteristic of InGaAs to InP. Therefore, the etching substantially stops after exposing the InP substrate. After removing the photo-resist 53, the sub-collector mesa 3 shown in FIG. 4C can be obtained. The sub-collector mesa electrically isolates respective transistors formed on the semi-insulating substrate.

(Electrode Formation)

In FIG. 5A, a patterned photo-resist 61 is formed on the substrate so as to cover the substrate and the portion of sub-collector mesa 3. The pattern formed with the resist 61 opens the emitter contact mesa 8, the primary mesa 10 and a portion of the sub-collector mesa 3, to which electrodes are formed.

A metal film 81 composed of titanium (Ti), platinum (Pt), titanium (Ti), and gold (Au) is deposited in this order by a vacuum evaporation technique not only to the exposed region but also the surface of the photo-resist. A thickness of gold is about 160 nm, while those of the rest metals are about 20 nm, respectively. As illustrated in FIG. 5B, the cross section of the emitter contact mesa 8 is a reverse trapezoid with an overhang. Therefore, a region where metals 81 are not deposited by the overhang may appear on the surface of the emitter layer 7, whereby this region separates the metal film deposited on the emitter contact mesa 8 from the metal film on the emitter layer 7. The former metal is an emitter electrode and the latter is a base electrode.

Since the base layer 6 and the collector layer 7 also has the cross section of the reverse trapezoid, which forms the overhang of the base layer 6 to the collector layer 5, a region where the metal film 81 is not deposited appears on the surface of the sub-collector layer 3. This region separates the metal film deposited on the sub-collector layer from the metal film on the emitter layer. After removing the mask 61 with the meal film thereon, the electrodes of the emitter 21, the base 22 and the collector 23 are formed simultaneously.

The process described above securely separates the electrodes 21 to 23 with each other without further processing of the metal film, such as etching of the metal. Moreover, the base electrode 22 can close to the emitter contact mesa 8 without contacting thereto. It is able to close the base electrode 22 as close as about 0.3 μm to the emitter contact mesa 8. This reduces the base resistance, thereby enhances the high frequency performance of the HBT.

Alloying metal deposited in the previous process by about one minutes at 400° C. within an inert gas atmosphere realizes an un-rectified contact characteristic to the respective semiconductor layers. Although the base electrode 22 is formed on the emitter layer 7, metals in the base electrode 22 diffuses into the base layer 6 through the emitter layer 7 because the thickness of the emitter layer is only about 10 nm, thereby contacts to the base layer.

(Wiring Formation)

After the alloying of the electrode metal, a passivation film 11 made of inorganic material such as silicon nitride (SiN) covers the entire portion of the device. The film 11 not only passivates the side surface of the respective mesa but also prevents the invasion of water and sodium into semiconductor materials, thereby enhancing the reliability of the HBT 1. Following to the deposition of the passivation film 11, openings in the passivation film 11 are formed by the etching with a photo-resist as an etching mask, a stacked metal of titanium (Ti), platinum (Pt) and gold (Au) is plugged in the openings, and the wiring connected to the base electrode 22 and the collector electrode 23 are formed with the same metal, as illustrated in FIG. 6A.

Another insulating film 12 is deposited by the plasma-enhanced chemical vapor deposition technique so as to cover the wiring 32, 33 and the previously deposited insulating film 11. The insulating film 12 may be SiN. Next, a SOG (Spin-On-Glass) film 13 is coated on the second insulating film 12, etched for the planation, and finally further insulating film 14 is deposited thereon. A via-hole on the emitter electrode is formed by the etching of the final insulating film 14 with a photo-resist as a mask, and is plugged with gold metal. After forming the wiring 31 by the similar process to the formation of the wiring 32,33, the HBT 1 with the wiring connected to the respective electrodes is completed, as illustrated in FIG. 6B.

In the process described above, the relation between temperatures is defined as follows:

$$T < T_A \leq 600° \text{ C.},$$

where T is the growth temperature of the emitter film 70 and the emitter contact film 80 and $T_A$ is the annealing temperature after the growth of all semiconductor films. Since the annealing is performed at the temperature $T_A$ higher than the growth temperature, hydrogen atoms captured with carbon atoms in the base film 60 can easily dissociate therefrom, and can pass the emitter film 70 and the emitter contact film 80. Moreover, since $T_A$ is below 600° C., it is avoided to deteriorate the morphology of the surface of the emitter contact film 80.

The method for manufacturing the HBT of the present invention, since the annealing of the grown semiconductor films is performed in the atmosphere of hydrogen or nitrogen, it is not required to provide a supplemental line for supplying a special material, such as Tri-Methyl-Arsine (TMAs). Moreover, since the growth temperature of the emitter film 70 and the emitter contact film 80 is over 500° C., the films with good crystal quality can be obtained.

Next, the experiment to confirm the function of the present method will be described.

FIG. 7 illustrates a stacking configuration of a device under experiment, which was grown by the OMVPE technique. This stacked wafer comprised a semi-insulating InP substrate 20, a collector film 500, a base film 600, an emitter film 700, and an emitter contact film 800, which were successively grown on a semi-insulating InP substrate 20. This configuration was similar to that of the HBT 1, and the detailed specifications, such as a material and a thickness, are listed in Table II.

TABLE II

| Film | Material | Thickness (nm) |
|---|---|---|
| Emitter Contact 800 | un-doped InGaAs | 300 |
| Emitter 700 | un-doped InP | 10 |
| Base 600 | carbon-doped InGaAs | 370 |
| Collector 500 | un-doped InGaAs | 300 |

The flow rate of $CBr_4$ during the growth of the base film was so defined that the carbon concentration therein is about $3.0 \times 10^{19}$ $cm^{-3}$, which was determined by the SIMS (Secondary Ion Mass Spectrometry) analysis.

Sixteen (16) samples with stacking structure described above were divided into four groups with regard to the growth temperature, and each group has four samples. Namely, samples in group A were grown at 680° C. for the emitter contact film 800, the group B was grown at 630° C., the group C was grown at 580° C., and the group D was grown at 530° C., respectively. While, the emitter film 700 was grown at 500° C., the base film was 470° C., and the collector film was 630° C. for all groups.

(Annealing and Result)

Samples of respective groups from A to D were annealed subsequently to the growth of the emitter contact films at different conditions without carrying the samples out of the reactor chamber of the OMVPE. The annealing time was 5 minuets. After the annealing, the hole concentration in the base film 600 was checked by the Hall measurement with removing the emitter contact film 800. The results are listed in the next table III.

TABLE III

| | | Hole Concentration ($\times 10^{19}$ $cm^{-3}$) Annealing condition | | | |
|---|---|---|---|---|---|
| Group | Growth Temperature (° C.) | No Anneal | 500° C. hydrogen at $1.0 \times 10^4$ Pa | 600° C. nitrogen at $9.5 \times 10^4$ Pa | 650° C. nitrogen at $9.5 \times 10^4$ Pa |
| A | 680 | 0.5 | 0.5 | 0.6 | 0.6 |
| B | 630 | 1.0 | 0.9 | 1.1 | 0.9 |
| C | 580 | 0.9 | 1.1 | 2.1 | 1.6 |
| D | 530 | 0.4 | 1.0 | 2.2 | 1.9 |

In table III, the hole concentration increased for the sample of group C and also sample of group D, both were annealed at 600° C. in nitrogen atmosphere, as compared with samples not annealed in respective groups. Namely, such samples had the hole concentration greater than $2.0 \times 10^{19}$ $cm^{-3}$. Even when samples in group C or group D annealed at 500° C. in hydrogen atmosphere, the hole concentration did not increase. Further, any annealing did not cause the increasing of the hole concentration for samples in group A or group B.

With regard to samples that showed the increasing of the hole concentration, the relation between the growth temperature T and the annealing temperature $T_A$ satisfied the condition of:

$$T < T_A \leq 600° \text{ C.}$$

Moreover, with regard to the emitter film 700 and the emitter contact film 800 of those samples that showed the increasing of the hole concentration, the growth temperature of the films was higher than 500° C. This experimental result proofs the advantage of the present manufacturing method of the HBT.

Inspecting the surface of samples that increased the hole concentration thereof, the deterioration of the surface morphology was not recognized. However, in the manufacturing of the HBT, a supplemental InP layer may be grown on the emitter contact layer 80 when the faint deterioration of the surface morphology affects the performance of the transistor. Even when the surface of this supplemental InP layer is poor quality, the emitter contact with a good quality surface can be obtained by etching the supplemental InP layer after annealing for the dissociation of hydrogen atoms.

Another experiment for comparing the hole concentration in the base film were performed. The experiment was that only the base film was grown on the InP substrate under the same condition as that of the former experiment and annealed at 500° C. in hydrogen atmosphere. After annealing, the hole concentration of the sample was $2.2 \times 10^{19}$ cm$^{-3}$, which was nearly equal to the concentration of samples in group C and group D annealed at 600° C. in nitrogen atmosphere, as listed in table III. This experimental results means that, annealing samples in group C and group D at 600° C. in nitrogen atmosphere, hydrogen atoms in base film 600 can dissociate through the emitter film 700 and the emitter contact film 800. Namely, in the process of the manufacturing of the HBT 1, hydrogen atoms in base film 60 can dissociate therefrom by annealing even when the base film 60 is covered by the emitter film 70 and the emitter contact film 80, whereby the carbon atoms therein can be effectively activated to the Acceptor.

In the experiment described above, the emitter film 700 was un-doped, while the emitter layer of the HBT 1 is n-type doped with Si atoms. A p-n junction is formed at the interface between the base layer and the emitter layer. Although the diffusion of hydrogen atoms is obstructed at the p-n junction, it is considered that the hydrogen atom can diffuse over the p-n junction when the annealing temperature is higher than 500° C. It is known that the activation of the carbon atoms is performed by the annealing of 1 minutes at the temperature of 520° C. even the existence of the p-n junction. Therefore, by prolonging the annealing time, the hydrogen can dissociate from the base film through the p-n junction, thereby activating the carbon atom in the base film.

From the invention thus described, the invention and its application may be varied in many ways. In the explanation, although the growth temperature of the emitter film and that of the emitter contact film are equal, the temperatures may be different with each other as long as the condition that the temperature is below the annealing temperature $T_A$ is satisfied. Even in this condition, it is preferable to keep the growth temperature over 500° C.

In the embodiment, the emitter layer 7 is a thin layer with a thickness of about 10 nm. It may be applicable that the thickness of the emitter layer is about 300 nm with a carrier concentration of a surface portion thereof is as high as the emitter contact layer of the embodiment. By this configuration, the surface portion of the emitter layer can function as the emitter contact layer. Further, the emitter is made of InP in the embodiment, it is replaceable with InAlAs lattice matched to InP.

Although the annealing was performed within the OMVPE reactor chamber in the experiment, it is able to use a general furnace with a capability to supply hydrogen gas or nitrogen gas and heating the substrate up to about 600° C. It is further preferably to adjust the inner pressure of the furnace.

What is claimed is:

1. A method for manufacturing a hetero-junction bipolar transistor on a semiconductor substrate, comprising the steps of:

a) growing epitaxially a multi-layered semiconductor film having a collector film, a base film, an emitter film and an emitter contact film on the semiconductor substrate, the base film containing carbon atoms as a dopant material and at least the emitter film and the emitter contact film being grown at a growth temperature T;

b) annealing the multi-layered semiconductor film by a predetermined period at an annealing temperature $T_A$; and c) forming the emitter contact film to an emitter contact layer, the emitter film to an emitter layer, the base film to a base layer, and the collector film to a collector layer, wherein the growth temperature T and the annealing temperature $T_A$ satisfies a relation of $T < T_A \leq 600°$ C.

2. A method for manufacturing a hetero-junction bipolar transistor according to claim 1, wherein the growth temperature T is higher than 500° C.

3. A method for manufacturing a hetero-junction bipolar transistor according to claim 1, wherein the predetermined period is at least 5 minutes.

4. A method for manufacturing a hetero-junction bipolar transistor according to claim 1, wherein the annealing is performed in nitrogen atmosphere.

5. A method for manufacturing a hetero-junction bipolar transistor according to claim 1, wherein the growing of the multi-layered semiconductor film is performed by an OMVPE reactor chamber.

6. A method for manufacturing a hetero-junction bipolar transistor according to claim 5, wherein the annealing is performed within the OMVPE reactor chamber without carrying the semiconductor substrate out of the OMVPE reactor chamber.

7. A method for manufacturing a hetero-junction bipolar transistor according to claim 1, further comprising growing an additional cover layer after growing the multi-layered film, and removing the additional cover layer after annealing of the multi-layered film.

8. A method for manufacturing a hetero-junction bipolar transistor according to claim 7, wherein the additional cover layer is made of the same material as the emitter film.

9. A method for manufacturing a hetero-junction bipolar transistor according to claim 1, wherein the emitter contact film, the emitter film and the collector film are doped with Si.

10. A method for manufacturing a hetero-junction bipolar transistor according to claim 1, wherein the semiconductor substrate and the emitter film are made of InP, and the collector film, the base film, and the emitter contact film are made of InGaAs lattice matched to InP.

11. A method for manufacturing a hetero-junction bipolar transistor according to claim 1, wherein the semiconductor substrate is made of InP, the collector film, the base film, and the emitter contact film are made of InGaAs lattice matched to InP, and the emitter film is made of InAlAs lattice matched to InP.

* * * * *